(12) United States Patent
Bedell et al.

(10) Patent No.: US 7,049,660 B2
(45) Date of Patent: May 23, 2006

(54) HIGH-QUALITY SGOI BY OXIDATION NEAR THE ALLOY MELTING TEMPERATURE

(75) Inventors: Stephen W. Bedell, Wappingers Falls, NY (US); Anthony G. Domenicucci, New Paltz, NY (US); Keith E. Fogel, Mohegan Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/448,948

(22) Filed: May 30, 2003

(65) Prior Publication Data

US 2004/0238885 A1 Dec. 2, 2004

(51) Int. Cl.
*H01L 31/392* (2006.01)

(52) U.S. Cl. .................... 257/347; 257/19; 257/190; 257/189; 257/192; 257/616

(58) Field of Classification Search ................ 257/347, 257/19, 190, 189, 192, 616
See application file for complete search history.

(56) References Cited

U.S. PATENT DOCUMENTS

| | | | |
|---|---|---|---|
| 5,759,898 A | 1/1998 | Ek et al. | |
| 6,515,335 B1 * | 2/2003 | Christiansen et al. | 257/347 |
| 2003/0013305 A1 | 1/2003 | Sugii, et al. | |
| 2003/0139000 A1 * | 7/2003 | Bedell, et al. | 438/186 |
| 2004/0012075 A1 * | 1/2004 | Bedell, et al. | 257/616 |

FOREIGN PATENT DOCUMENTS

| | | |
|---|---|---|
| JP | 2000243946 | 8/2000 |
| WO | WO 02/082514 A1 | 10/2002 |
| WO | WO 03/063229 A1 | 7/2003 |

OTHER PUBLICATIONS

Kutsukake, et al., "Fabrication of Si–Ge–on Insulator through Thermal Diffusion of Ge on Si–on–Insulator Substrate", Jpn J. Appl. Phys. vol. 42:pp: L232–L234 Part 2. No. 3A, Mar. 1, 2003.

Luysberg, et al., Effect of helium ion implantation and annealing on the relaxation behavior of pseudomorphic Si1–x Ge x buffer layers on Si (100 substrates, Journal of Applied Physics, vol. 92:8 pp. 4290–4295, Oct. 15, 2002.

* cited by examiner

*Primary Examiner*—Long Pham
(74) *Attorney, Agent, or Firm*—Scully, Scott, Murphy & Presser, P.C.; Robert M. Trepp

(57) ABSTRACT

A method of forming a low-defect, substantially relaxed SiGe-on-insulator substrate material is provided. The method includes first forming a Ge-containing layer on a surface of a first single crystal Si layer which is present atop a barrier layer that is resistant to Ge diffusion. A heating step is then performed at a temperature that approaches the melting point of the final SiGe alloy and retards the formation of stacking fault defects while retaining Ge. The heating step permits interdiffusion of Ge throughout the first single crystal Si layer and the Ge-containing layer thereby forming a substantially relaxed, single crystal SiGe layer atop the barrier layer. Moreover, because the heating step is carried out at a temperature that approaches the melting point of the final SiGe alloy, defects that persist in the single crystal SiGe layer as a result of relaxation are efficiently annihilated therefrom.

13 Claims, 9 Drawing Sheets

HIGH-QUALITY SGOI BY OXIDATION NEAR THE ALLOY MELTING TEMPERATURE

RELATED APPLICATIONS

This application is related to co-pending and co-assigned U.S. patent application Ser. No. 10/055,138, filed Jan. 23, 2002, entitled "Method of Creating High-Quality Relaxed SiGe-On-Insulator for Strained Si CMOS Applications", as well as co-pending and co-assigned U.S. patent application Ser. No. 10/196,611, filed Jul. 16, 2002, entitled "Use Of Hydrogen Implantation To Improve Material Properties Of Silicon-Germanium-On-Insulator Material Made By Thermal Diffusion", the entire contents of each of which are incorporated herein by reference.

FIELD OF THE INVENTION

The present invention relates to a method of fabricating a semiconductor substrate material, and more particularly to a method of fabricating a low-defect, substantially relaxed SiGe-on-insulator (SGOI) substrate material. The low-defect, substantially relaxed SiGe-on-insulator substrate material of the present invention can be used as a lattice mismatched template for creating a strained Si layer thereon by subsequent Si epitaxial overgrowth. Such a substrate material is desired for the enhanced charge carrier transport properties within a strained Si layer and is a candidate for future high performance complementary metal oxide semiconductor (CMOS) applications. The present invention is also directed to a SiGe-on-insulator substrate material as well as structures which include at least the substrate material.

BACKGROUND OF THE INVENTION

In the semiconductor industry, there has recently been a high-level of activity using strained Si-based heterostructures to achieve high mobility structures for CMOS applications. Traditionally, the prior art method to implement this has been to grow strained Si layers on thick (on the order of from about 1 to about 5 micrometers) relaxed SiGe buffer layers.

Despite the high channel electron mobilities reported for prior art heterostructures, the use of thick SiGe buffer layers has several noticeable disadvantages associated therewith. First, thick SiGe buffer layers are not typically easy to integrate with existing Si-based CMOS technology. Second, the defect densities, including threading dislocations (TDs) and misfit dislocations, are from about $10^5$ to about $10^8$ defects/cm$^2$ which are still too high for realistic VSLI (very large scale integration) applications. Thirdly, the nature of the prior art structure precludes selective growth of the SiGe buffer layer so that circuits employing devices with strained Si, unstrained Si and SiGe materials are difficult, and in some instances, nearly impossible to integrate.

In order to produce relaxed SiGe material on a Si substrate, prior art methods typically grow a uniform, graded or stepped, SiGe layer to beyond the metastable critical thickness (i.e., the thickness beyond which dislocations form to relieve stress) and allow misfit dislocations to form, with the associated threading dislocations, through the SiGe buffer layer. Various buffer structures have been used to try to increase the length of the misfit dislocation section in the structures and thereby to decrease the TD density.

In addition to the TDs that form during the relaxation process, stacking faults (SF) have been observed to form under certain strain and annealing conditions; see R. Hull and J. C. Bean, J. Vac. Sci. Technol., Vol. 7 (4), 1989, pg. 2580. It is believed that the presence of a SF defect within a semiconductor material represents a more significant threat to proper electrical behavior of the material compared to an isolated TD.

Another prior art approach, such as described in U.S. Pat. Nos. 5,461,243 and 5,759,898, both to Ek, et al., provides a structure with a relaxed and reduced defect density semiconductor layer wherein a new strain relief mechanism operates whereby the SiGe buffer layer relaxes while reducing the generation of TDs within the SiGe layer.

Co-pending and co-assigned U.S. patent application Ser. No. 10/055,138, filed Jan. 23, 2002, entitled "Method of Creating High-Quality Relaxed SiGe-On-Insulator for Strained Si CMOS Applications" provides a unique way of fabricating high-quality, substantially relaxed SiGe-on-insulator substrates. In the '138 application, a high-quality, substantially relaxed SiGe alloy layer is formed atop a first single crystal Si layer by first forming a SiGe or pure Ge layer on the surface of the first single crystal Si layer, which is present atop a barrier layer that is resistance to Ge diffusion, and then heating the layers at a temperature that permits interdiffusion of Ge throughout the first single crystal Si layer and the SiGe or pure Ge layer thereby forming a substantially relaxed, single crystal SiGe layer atop the barrier layer. The heating step is performed at various temperatures and a statement is made therein that a tailored heat cycle that is based upon the melting point of the SiGe layer may be used. Specifically, the '138 application states that "the temperature is adjusted to tract below the melting point of the SiGe layer".

The '138 application provides no specifics about the tailored heat cycle, other than the temperature is adjusted below the melting point of the SiGe. Additionally, no recognition was made in that disclosure which indicates that the tailored heat cycle could be used as a means of substantially reducing the residual defect density in the SiGe alloy layer. Moreover, the disclosure of the '138 application does not recognize that the bulk of the oxidation anneal process should be carried out at or near the melting point of SiGe. Furthermore, the disclosure of the '138 application does not recognize that the temperature of the tailored heating cycle could be adjusted so as to eliminate specific types of defects.

SUMMARY OF THE INVENTION

One object of the present invention is to provide a method of fabricating thin, high-quality, substantially relaxed SiGe-on-insulator substrate materials in which the SiGe layer has a low-defect density, on the order of about $10^7$ defects/cm$^2$ or less.

Another object of the present invention is to provide a method of fabricating thin, high-quality, substantially relaxed SiGe-on-insulator substrate materials in which a heating step is employed that is capable of substantially reducing the threading defect density in the SiGe alloy layer.

Still another object of the present invention is to provide a method of fabricating thin, high-quality, substantially relaxed SiGe-on-insulator substrate materials in which a heating step is employed that is capable of substantially reducing the stacking fault defect density in the SiGe alloy layer.

A further object of the present invention is to provide a method of fabricating thin, high-quality, substantially relaxed SiGe-on-insulator substrate materials in which a heating step is performed under conditions that efficiently annihilate existing defects, while retarding the formation of certain defects in the SiGe alloy layer as a result of relaxation of the initially strained SiGe.

A yet further object of the present invention is to provide a method of fabricating thin, high-quality, low-defect density, substantially relaxed SiGe-on-insulator substrate materials, which is compatible with CMOS processing steps.

An even further object of the present invention is to provide a method of fabricating thin, high-quality, low-defect density, substantially relaxed SiGe-on-insulator substrate materials which can be used as lattice mismatched templates, i.e., substrates, for forming strained Si layers.

A still further object of the present invention is to provide strained Si/substantially relaxed SiGe-on-insulator structures that have high carrier mobility and are useful in high-performance CMOS applications.

These and other objects and advantages are achieved in the present invention by utilizing a method which includes first forming a Ge-containing layer, such as a SiGe alloy or pure Ge, on a surface of a first single crystal Si layer, said first single crystal Si layer is present atop a barrier layer that is resistant to Ge diffusion; and thereafter a heating step is performed at a temperature that approaches (i.e., at or near) the melting point of the SiGe alloy while retaining Ge, but not less than the temperature required to retard SF defect generation; the variation from the actual melting point of a specific Ge content SiGe alloy may be slightly less, on the order of −50° C., from the actual melting point of the SiGe alloy while greater than about 1230° C. to retard SF generation.

The heating step of the present invention permits interdiffusion of Ge throughout the first single crystal Si layer and the Ge-containing layer thereby forming a substantially relaxed, single crystal SiGe layer atop the barrier layer. Moreover, because the heating step of the present is carried out at a temperature that approaches the melting point of the final single crystal SiGe layer, defects that persist in the single crystal SiGe layer as a result of relaxation are efficiently annihilated therefrom. Oxidation performed at temperatures $\geq 1230°$ C. also retards the formation of SF defects within the SiGe layer. It is noted that the substantially relaxed, single crystal SiGe layer is comprised of a homogeneous mixture of the Ge-containing layer as well as the first single crystal Si layer.

Following these steps of the present invention, a strained Si layer may be grown epitaxially atop the substantially relaxed single crystal SiGe layer to form a strained Si/relaxed SiGe-containing heterostructure that can be used in a variety of high-performance CMOS applications.

In some embodiments of the present invention, the first single crystal Si and barrier layer are components of a silicon-on-insulator (SOI) substrate. In other embodiments, the barrier layer is formed atop a surface of a semiconductor substrate, and thereafter the first single crystal Si layer is formed atop the barrier layer. The latter substrate material is a non-SOI substrate.

The present method also contemplates the use of barrier layers that are unpatterned (i.e., barrier layers that are continuous) or patterned (i.e., discrete and isolated barrier regions or islands which are surrounded by semiconductor material).

In yet another embodiment of the present invention, a Si cap layer is formed atop the Ge-containing layer prior to heating the structure at or near the melting point of the final SiGe layer. This embodiment of the present invention alters the thermodynamic stability (in terms of preventing defect production) of the SiGe layer before annealing. The SiGe layer has a thickness of about 2000 nm or less, with a thickness of from about 10 to about 200 nm being more highly preferred.

In still yet another embodiment of the present invention, an ion implantation step may be performed prior to heating.

Another aspect of the present invention relates to the SiGe-on-insulator substrate material that is formed utilizing the above-mentioned processing steps. Specifically, the inventive substrate material comprises a Si-containing substrate; an insulating region that is resistant to Ge diffusion present atop the Si-containing substrate; and a substantially relaxed SiGe layer present atop the insulating region, wherein the substantially relaxed SiGe layer has a thickness of about 2000 nm or less and a defect density of about $10^7$ defects/cm$^2$ or less.

A yet further aspect of the present invention relates to a heterostructure which includes at least the above-mentioned substrate material. Specifically, the heterostructure of the present invention comprises a Si-containing substrate; an insulating region that is resistant to Ge diffusion present atop the Si-containing substrate;

a substantially relaxed SiGe layer present atop the insulating region, wherein the substantially relaxed SiGe layer has a thickness of about 2000 nm or less and a defect density of about $10^7$ atoms/cm$^2$ or less; and a strained Si layer formed atop the substantially relaxed SiGe layer.

Other aspects of the present invention relate to superlattice structures as well as templates for other lattice mismatched structures which include at least the SiGe-on-insulator substrate material of the present invention.

DETAILED DESCRIPTION OF THE INVENTION

Figure 1A:
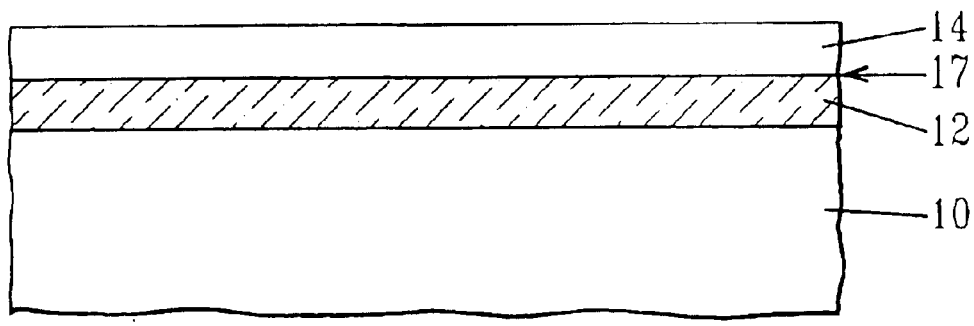
FIGS. 1A–1E are pictorial representations (through cross-sectional views) showing the basic processing steps that are employed in the present invention in fabricating a thin, high-quality, substantially relaxed SiGe-on-insulator substrate material wherein the initial substrate includes an unpatterned diffusion barrier region.

The present invention, which provides a method of fabricating thin, high-quality, substantially relaxed SiGe-on-insulator substrate materials which can then serve as a lattice mismatched template for subsequent overgrowth of epitaxial Si, will now be described in greater detail by referring to the drawings that accompany the present application. In the accompanying drawings, like and/or corresponding elements are referred to by like reference numerals.

The present application provides a direct approach to the formation of low-defect, substantially relaxed SiGe-on-insulator substrate materials whereby the heating step of the present invention is performed at a temperature approaching the melting point of the SiGe alloy, while high enough to retard SF formation. The result of the controlled heating step, which is performed at or near the melting point of the final relaxed SiGe alloy layer, is a reduction in the residual defect density compared to similar layers that are annealed at lower temperatures.

Figure 2A:
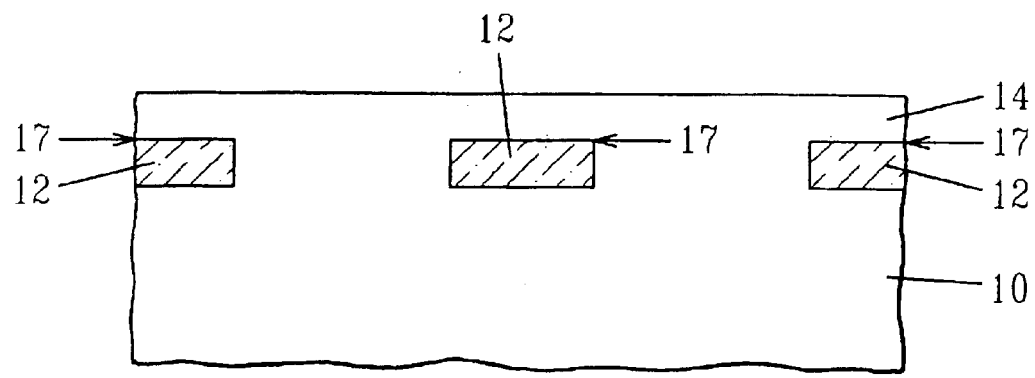
FIGS. 2A–E are pictorial representations (through cross-sectional views) showing the basic processing steps that are employed in an alternative embodiment of the present invention in fabricating a thin, high-quality, substantially relaxed SiGe-on-insulator substrate material wherein the initial substrate includes a patterned diffusion barrier region.

Reference is first made to FIGS. 1A and 2A, which show initial substrate materials that can be employed in the present invention. Specifically, the initial substrate materials illustrated in FIGS. 1A and 2A each comprise a Si-containing semiconductor substrate 10, a barrier layer 12 which is resistant to Ge diffusion (hereinafter "barrier layer") present atop a surface of the Si-containing semiconductor substrate 10 and a first single crystal Si layer 14 having misfit and TD densities of less than about $1 \times 10^4$ defects/cm$^2$ present atop the barrier layer 12. In the drawings, reference numeral 17 denotes the interface between the barrier layer 12 and the first single crystal Si layer 14.

The difference between the two initial structures depicted in the drawings is that, in FIG. 1A, the barrier layer 12 is present continuously throughout the entire structure, whereas in FIG. 2A, the barrier layer 12 is present as discrete and isolated regions or islands that are surrounded by semiconductor material, i.e., layers 10 and 14. The initial structure shown in FIG. 1A includes an unpatterned barrier layer, whereas the initial structure of FIG. 2A includes a patterned barrier layer.

Notwithstanding whether the barrier layer 12 is patterned or unpatterned, the initial structure may be a conventional silicon-on-insulator (SOI) substrate material wherein region 12 is a buried oxide region which electrically isolates the first single crystal Si layer 14 from the Si-containing substrate semiconductor substrate 10. The term "Si-containing" as used herein denotes a semiconductor substrate that includes at least silicon. Illustrative examples include, but are not limited to: Si, SiGe, SiC, SiGeC, Si/Si, Si/SiC, Si/SiGeC, and preformed silicon-on-insulators which may include any number of buried oxide (continuous, non-continuous or mixtures of continuous and non-continuous) regions present therein.

The SOI substrate may be formed utilizing conventional SIMOX (separation by ion implantation of oxygen) processes well known to those skilled in the art, as well as the various SIMOX processes mentioned in co-assigned U.S. patent applications Ser. Nos. 09/861,593, filed May 21, 2001; 09/861,594, filed May 21, 2001; 09/861,590, filed May 21, 2001; 09/861,596, filed May 21, 2001; and 09/884,670, filed Jun. 19, 2001 as well as U.S. Pat. No. 5,930,634 to Sadana, et al., the entire contents of each are incorporated herein by reference. Note that the process disclosed in the '590 application can be employed herein to fabricate the patterned substrate shown in FIG. 2A. Alternatively, the SOI substrate material may be made using other conventional processes including, for example, a thermal bonding and layer transfer process.

In addition to SOI substrates, the initial substrates shown in FIGS. 1A and 2A may be a non-SOI substrate that is made using conventional deposition processes as well as lithography and etching (employed when fabricating a patterned substrate). Specifically, when non-SOI substrates are employed, the initial structure is formed by depositing a Ge diffusion barrier layer atop a surface of a Si-containing substrate, via conventional deposition or thermal growing processes, optionally patterning the barrier layer by employing conventional lithography and etching; and thereafter forming a single crystal Si layer atop the barrier layer using conventional deposition processes including chemical vapor deposition (CVD), plasma-assisted CVD, sputtering, evaporation, chemical solution deposition or epitaxial Si growth.

Barrier layer 12 of the initial structure shown in FIGS. 1A and 2A comprises any insulating material that is highly resistant to Ge diffusion. Examples of such insulating and Ge diffusion resistant materials include, but are not limited to: crystalline or non-crystalline oxides or nitrides.

The thickness of the various layers of the initial structure may vary depending on the process used in making the same. Typically, however, the single crystal Si layer 14 has a thickness of from about 1 to about 2000 nm, with a thickness of from about 20 to about 200 nm being more highly preferred. In the case of the barrier layer 12 (i.e., Ge diffusion resistant layer), that layer may have a thickness of from about 1 to about 1000 nm, with a thickness of from about 20 to about 200 nm being more highly preferred. The thickness of the Si-containing substrate layer, i.e., layer 10, is inconsequential to the present invention. The thicknesses provided above are exemplary and by no ways limit the scope of the present invention.

Figure 1B:
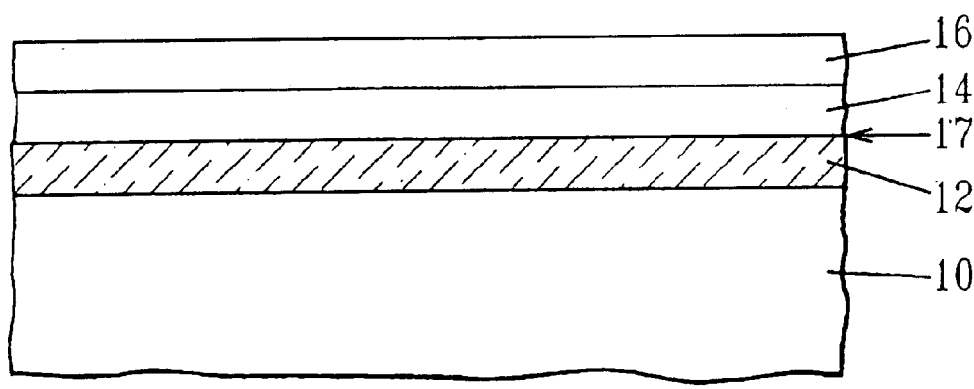
Figure 2B:
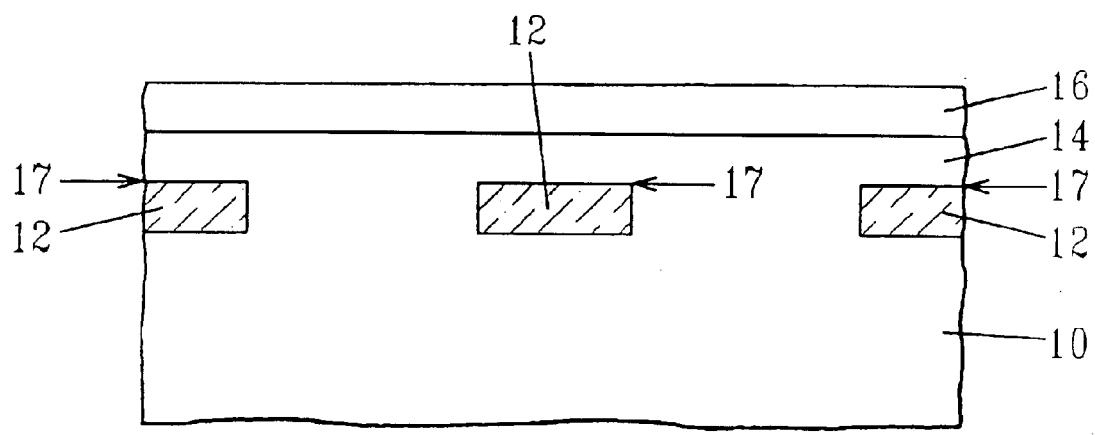

FIGS. 1B and 2B illustrate the structure that is formed after a Ge-containing layer 16 is formed atop the first single crystal Si layer 14. The Ge-containing layer 16 includes a SiGe alloy or pure Ge. The term "SiGe alloy" includes SiGe materials that comprise up to 99.99 atomic percent Ge, whereas pure Ge includes layers that comprise 100 atomic percent Ge. When SiGe layers are employed, it is preferred that the Ge content in the SiGe layer be from about 0.1 to about 99.9 atomic percent, with a Ge atomic percent of from about 10 to about 35 being even more highly preferred. The SiGe alloys may be single-crystal, amorphous or polycrystalline.

In accordance with the present invention, the Ge-containing layer 16 is formed atop the first single crystal Si layer 14 using any conventional epitaxial growth method that is well known to those skilled in the art which is capable of (i) growing a thermodynamically stable (below a critical thickness) Ge-containing layer, (ii) growing a Ge-containing layer that is metastable and free from defects, i.e., misfit and TD dislocations, or (iii) growing a partially or fully relaxed SiGe layer; the extent of relaxation being controlled by growth temperature, Ge concentration, thickness, or the presence of a Si capping layer. Illustrative examples of such epitaxial growing processes that are capable of satisfy conditions (i), (ii), or (iii) include, but are not limited to: low-pressure chemical vapor deposition (LPCVD), ultra-high vacuum chemical vapor deposition (UHVCVD), atmospheric pressure chemical vapor deposition (APCVD), molecular beam (MBE) epitaxy and plasma-enhanced chemical vapor deposition (PECVD).

The thickness of the Ge-containing layer 16 formed at this point of the present invention may vary, but typically the Ge-containing layer 16 has a thickness of from about 10 to about 500 nm, with a thickness of from about 20 to about 200 nm being more highly preferred.

Figure 3A:
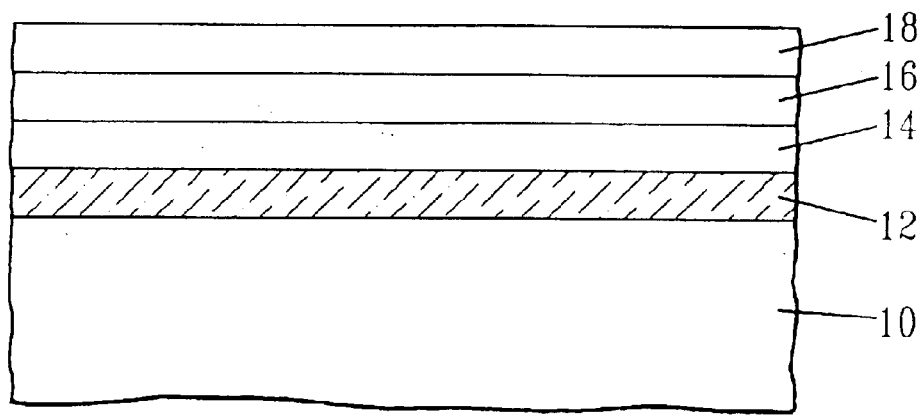
FIGS. 3A–3B are pictorial representations (through cross-sectional views) showing an alternative embodiment of the present invention wherein a Si cap layer is formed atop a Ge or SiGe layer which is formed on an unpatterned (3A) or patterned (3B) substrate.
Figure 3B:
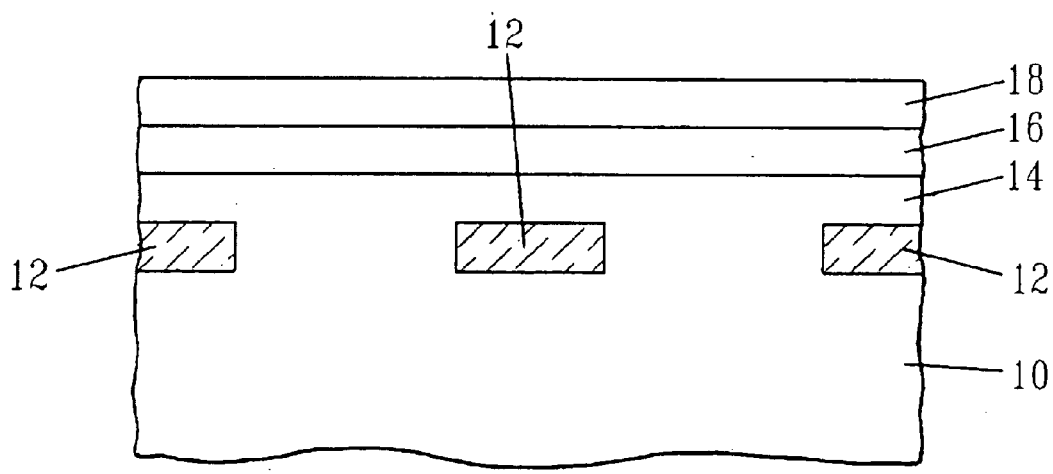

In an alternative embodiment of the present invention, see FIGS. 3A-3B, an optional cap layer 18 is formed atop the Ge-containing layer 16 prior to performing the heating step of the present invention. The optional cap layer 18 employed in the present invention comprises any Si material including, but not limited to: epitaxial silicon (or SiGe) (epi-Si), amorphous silicon (a:Si), amorphous SiGe, single or polycrystalline Si or any combination thereof including multilayers. In a preferred embodiment, the cap layer is comprised of epi Si. It is noted that layers 16 and 18 may, or may not, be formed in the same reaction chamber.

When present, the optional cap layer 18 has a thickness of from about 1 to about 100 nm, with a thickness of from about 1 to about 30 nm being more highly preferred. The optional cap layer 18 is formed utilizing any well-known deposition process including the epitaxial growth processes mentioned above.

In one embodiment of the present invention, it is preferred to form a Ge-containing layer (15 to 20 atomic percent Ge) having a thickness of from about 1 to about 2000 nm on the surface of a single crystal Si layer, and thereafter forming a Si cap layer having a thickness of from about 1 to about 100 nm atop the Ge-containing layer.

After forming the Ge-containing layer 16 (with or without the optional cap layer 18) atop the initial structure, the structure shown in either FIG. 1B or 2B (with or without the optional cap) may then be subjected to an optional ion implantation step wherein ions that are capable of forming defects that allow enhanced relaxation at or near the interface 17 is performed. Examples of such defects that permit enhanced relaxation to occur include: platelet defects or bubble-like defects, as in the case for hydrogen ion implantation. The implant may be performed with or without the use of an implantation mask.

Figure 1C:
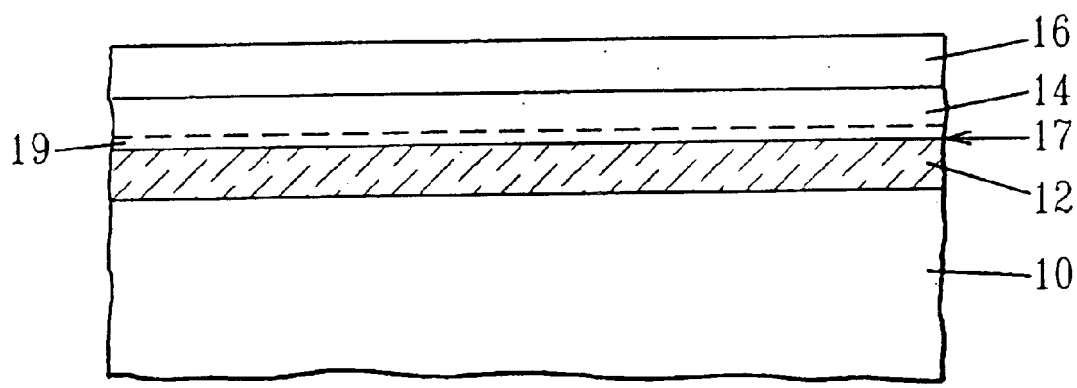
Figure 2C:
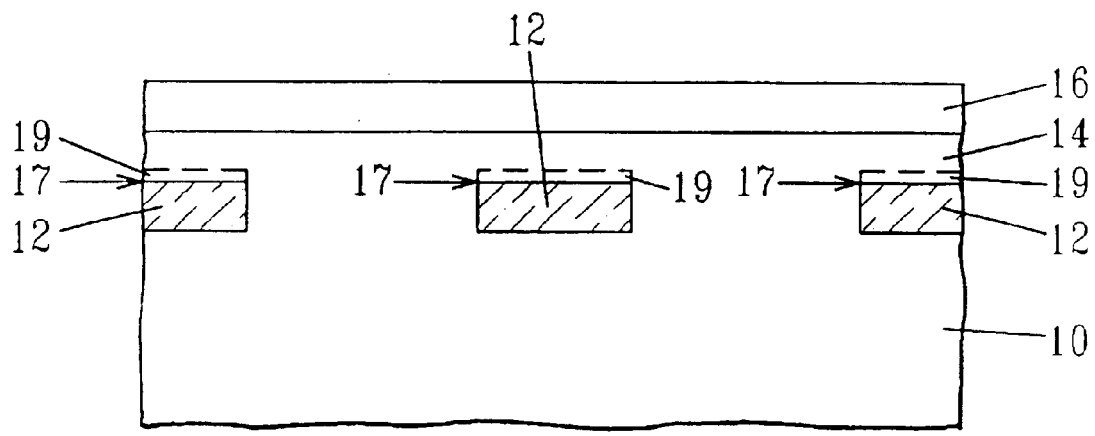

The structure after this implantation step is shown in FIG. 1C or 2C. In these figures, reference numeral 19 denotes the defect regions formed by the ion implantation step. The defect regions solve the problem of defect production in the SiGe alloy/single crystal Si bilayer by facilitating relaxation of the bilayer to occur. Specifically, relaxation occurs by plastically deforming the defect region that is present at or near the interface 17.

The defects, which permit enhanced relaxation to occur at or near the interface 17, are formed by implanting ions such as hydrogen, deuterium, helium, oxygen, neon, and mixtures thereof into the various layers using implant conditions which maintain the peak of the ion range at or near interface 17. Isotopes of the aforementioned ions are also contemplated herein. Preferred ions used in the present invention are hydrogen ions ($H^+$). It is noted that other species of hydrogen such as $H_2^+$ can also contemplated herein.

The implant step of the present invention is conducted at approximately room temperature, i.e., a temperature of from about 283K to about 303K, using a beam current density of from about 0.01 to about 10 microamps/cm$^2$. Implantation at different temperatures and/or using other beam current densities may affect the relaxation behavior.

The concentration of the implant species used in forming the platelet defects may vary depending upon the type of implant species employed. Typically, however, the concentration of implanting ions used at this point of the present invention is below 3E16 cm$^2$, with an ion concentration of from about 1E16 to about 2.99E16 cm$^2$ being more highly preferred. The energy of this implant may also vary depending upon the type of ion that is being implanted, with the proviso that the implant energy must be capable of positioning ions at or near interface 17. For example, when hydrogen is employed as the implant ion, the energy used to ensure platelet formation at or near interface 17 is from about 1 to about 100 keV, with an energy of from about 3 to about 20 keV being more highly preferred.

The implantation of the foregoing energetic ions into or near the strained SiGe/Si interface creates defects that can serve as efficient dislocation nucleation sites which allow the SiGe layer to relax more efficiently. The randomness of the defect sites caused by this implantation also reduces defect pinning caused by interactions between moving dislocations and thereby makes the relaxation process more efficient.

Figure 1D:
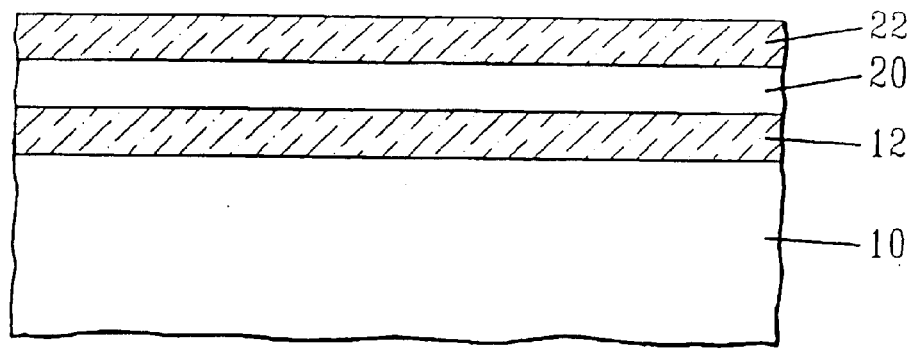
Figure 2D:
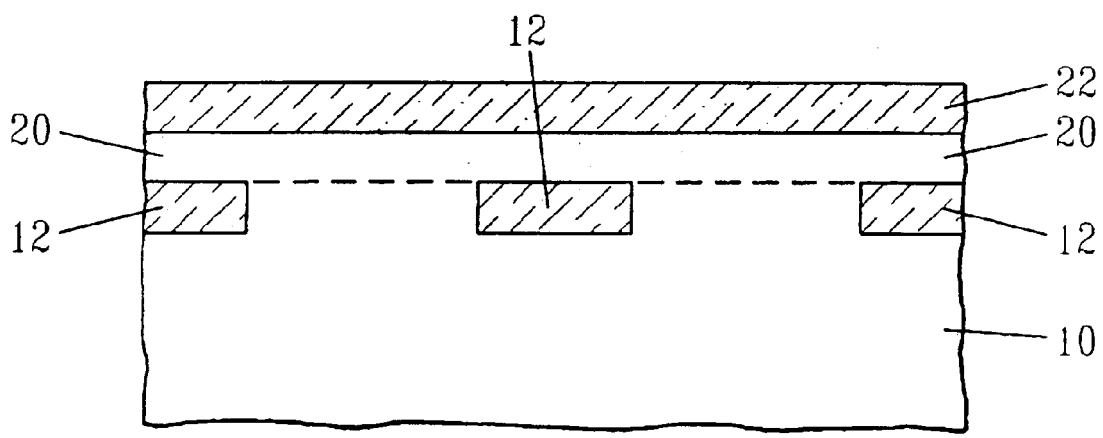

After forming the Ge-containing layer 16 (with or without the optional cap layer 18 and with or without the implant) atop the initial structure, the structure (with or without the optional cap layer 18 and with or without the implant) is then heated, i.e., annealed, at a temperature which substantially annihilates defects caused by strained relaxation, while permitting interdiffusion of Ge throughout the first single crystal Si layer 14, the Ge-containing layer 16 and, if present, the optional Si cap 18 thereby forming a substantially relaxed, single crystal SiGe layer 20 atop the barrier layer 12. Note that an oxide layer 22 is formed atop the SiGe layer 20 during the heating step. Oxide layer 22 is typically, but not always, removed from the structure after the heating step using a conventional wet etch process wherein a chemical etchant such as HF that has a high selectivity for removing oxide as compared to SiGe is employed. The resultant structure formed after the heating step has been performed is shown, for example in FIG. 1D or 2D.

Note that when the oxide layer 22 is removed, a second single crystal Si layer can be formed atop the SiGe layer 20 and the above processing steps of the present invention may be repeated any number of times to produce a multilayered relaxed SiGe substrate material.

The oxide layer 22 formed after the heating step of the present invention has a variable thickness which may range from about 10 to about 1000 nm, with a thickness of from about 20 to about 500 nm being more highly preferred.

Figure 5:
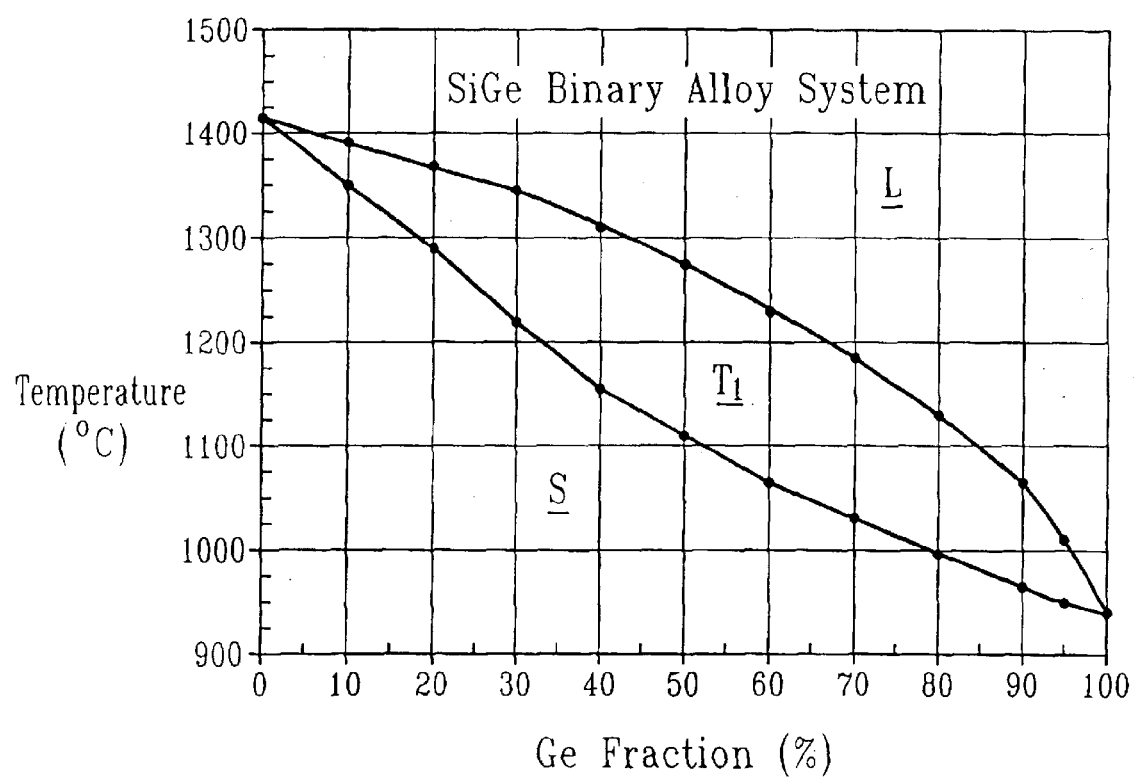
FIG. 5 is a graph showing the melting point vs. Ge content of a SiGe binary alloy system. The S denotes a solid, the L is a liquid, and the area between the two curves is the transition phase between solid and liquid.

Specifically, the heating step of the present invention is an annealing step that is performed at a temperature that is at or near the melting point of a selected SiGe alloy, yet at a temperature high enough to retard the formation of SF defects. The selected SiGe alloy is based on the Ge content desired in the final relaxed SiGe layer. FIG. 5 is a graph showing the melting point vs. Ge content of a SiGe binary alloy system. The S denotes a solid, the L is a liquid, and the area between the two curves is the transition phase between solid and liquid. The temperature of the heating step of the present invention substantially tracts along the bottom curve in the drawing, which is labeled as $T_1$ for convenience. The temperature used in the heating step of the present invention may be slightly less than the actual melting point for a given Ge content.

Specifically, the heating temperature may be performed at the actual melting point of a selected SiGe alloy layer or at a temperature of about 50° C. below the actual melting point but above about 1230° C. to reduce SF defect generation during oxidation. Care should be taken not to heat the structure in the area between the two curves since agglomeration of the SiGe alloy can occur if heating occurs within that area. The heating step of the present invention, which is a function of Ge content, may be performed at a temperature of from about 1230° C. (for 30% Ge) to about 1410° C. (for 0.1% Ge in a SiGe alloy).

Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The heating step may be carried out for a variable period of time which typically ranges from about 10 to about 1800 minutes, with a time period of from about 30 to about 600 minutes being more highly preferred. The heating step may be carried out at a single targeted temperature, or various ramp and soak cycles using various ramp rates and soak times can be employed. A soak step may be used below the actual melting point of a given SiGe alloy to tailor the types of defects present in the structure.

The heating step is performed under an oxidizing ambient to achieve the presence of a surface oxide layer, i.e., layer 22, which acts as a diffusion barrier to Ge atoms. Therefore, once the oxide layer is formed on the surface of the structure, Ge becomes trapped between the barrier layer 12 and the oxide layer 22. As the surface oxide increases in thickness, the Ge becomes more uniformly distributed throughout layers 14, 16, and optionally 18, but it is continually and efficiently rejected from the encroaching oxide layer. So as the (now homogenized) layers are thinned during this heating step, the relative Ge fraction increases.

It has been determined in the present invention, that the bulk of the oxidation be carried out at or above approximately 1230° C. to reduce the generation of SF defects as the SiGe layer is thinned. Therefore, it is contemplated that temperature be ramped down under dilute-oxygen or non-oxidizing ambient so as to avoid an increase in the generation rate of SF defects as a result of oxidation below about 1230° C. The oxidation temperature being between 1230 and 1350° C.; with 1250 to 1325° C. being more highly preferred.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

The role of the heating step of the present invention is (1) to annihilate defects formed from strain relaxation; (2) allow Ge atoms to diffuse more quickly thereby maintaining a homogeneous distribution during annealing; and (3) to subject the initial layer structure to a thermal budget which will facilitate an equilibrium configuration in such a way as to minimize the number of defects generated during oxidation. After this heating step has been performed, the structure includes a uniform and substantially relaxed, low-defect SiGe alloy layer, i.e., layer 20, sandwiched between the barrier layer 12 and surface oxide layer 22. See FIG. 1D or 2D.

In accordance with the present invention, the relaxed SiGe layer 20 has a thickness of about 2000 nm or less, with a thickness of from about 10 to about 100 nm being more highly preferred. Note that the relaxed SiGe layer 20 formed in the present invention is thinner than prior art SiGe buffer layers and has a TD density of from about 2 to 10 times lower than SGOI formed at 1200° C. and a SF defect density reduction by about a factor of 100. See FIG. 8. This represents a two order of magnitude reduction in the defect density as compared to the process disclosed in the '138 application.

The relaxed SiGe layer formed in the present invention has a final Ge content of from about 0.1 to about 30 atomic percent, with an atomic percent of Ge of from about 10 to about 30 being more highly preferred. Another characteristic feature of relaxed SiGe layer 22 is that it has a measured lattice relaxation of from about 1 to about 99%, with a measured lattice relaxation of from about 50 to about 80% being more highly preferred.

Figure 1E:
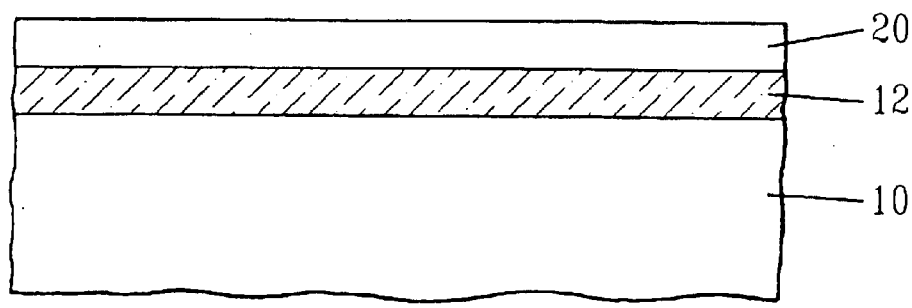
Figure 2E:
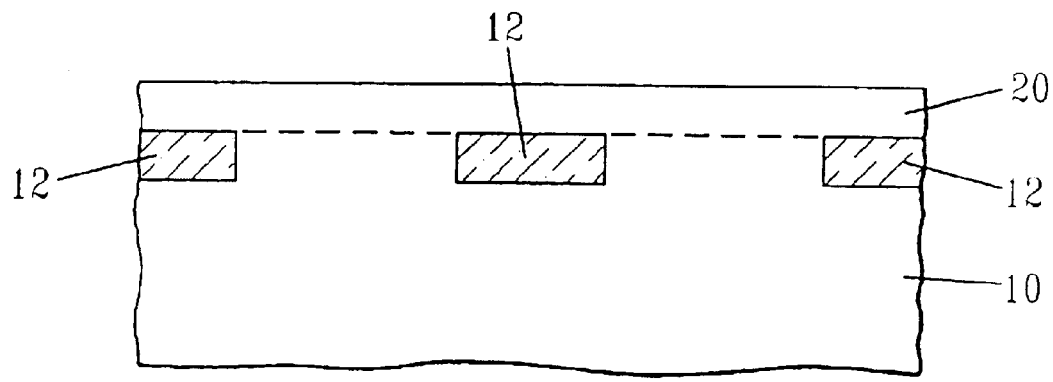

As stated above, the surface oxide layer 22 may be stripped at this point of the present invention so as to provide the SiGe-on-insulator substrate material shown, for example, in FIGS. 1E or 2E (note that the substrate material does not include the cap layer since that layer has been used in forming the relaxed SiGe layer).

Figure 4A:
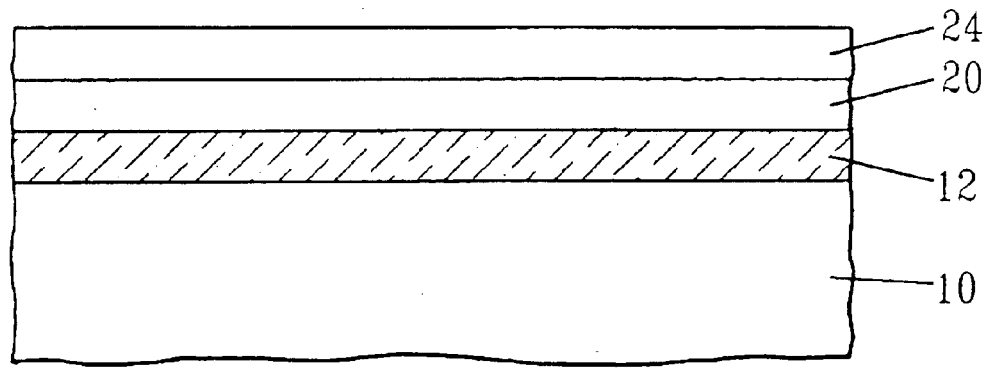
FIGS. 4A–4B are pictorial representations (through cross-sectional views) showing the formation of a strained Si layer on the thin, high-quality, substantially relaxed SiGe-on-insulator substrate material of FIGS. 1E and 2E, respectively.
Figure 4B:
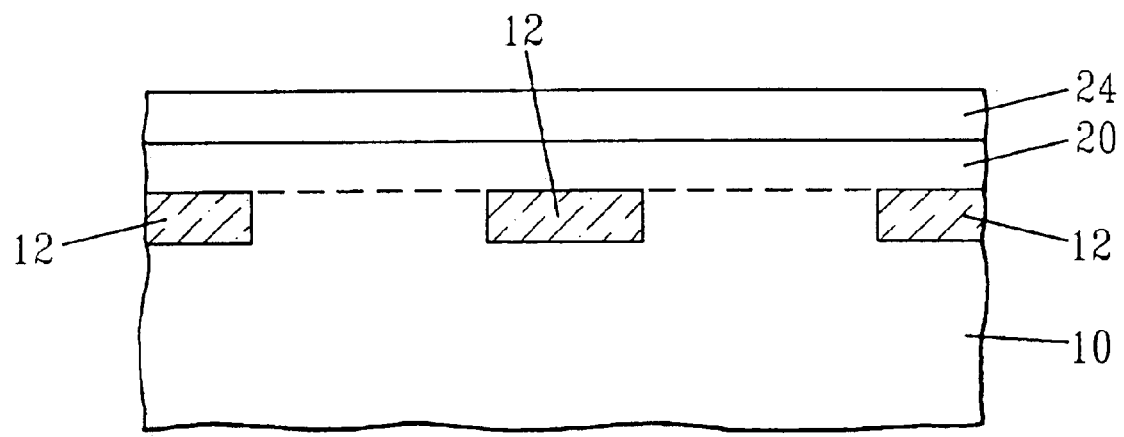

FIGS. 4A–B show the structure that is obtained after forming Si layer 24 atop SiGe layer of FIGS. 1E and 2E, respectively. Si layer 24 is formed using a conventional epitaxial deposition process well known in the art. The thickness of the epi-Si layer 24 may vary, but typically, the epi-Si layer 24 has a thickness of from about 1 to about 100 nm, with a thickness of from about 1 to about 30 nm being more highly preferred.

In some instances, additional SiGe can be formed atop the relaxed SiGe layer 20 utilizing the above-mentioned processing steps, and thereafter the epi-Si layer 24 may be formed. Because layer 20 has a large in-plane lattice parameter as compared to the epi-Si layer 24, epi-Si layer 24 will be strained in a tensile manner.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers Si and SiGe formed atop the substantially relaxed SiGe layer of the substrate material.

In the case of lattice mismatched structures, GaAs, GaP or other like compound would be formed atop the substantially relaxed SiGe layer of the inventive SiGe-on-insulator substrate material.

Figure 6:
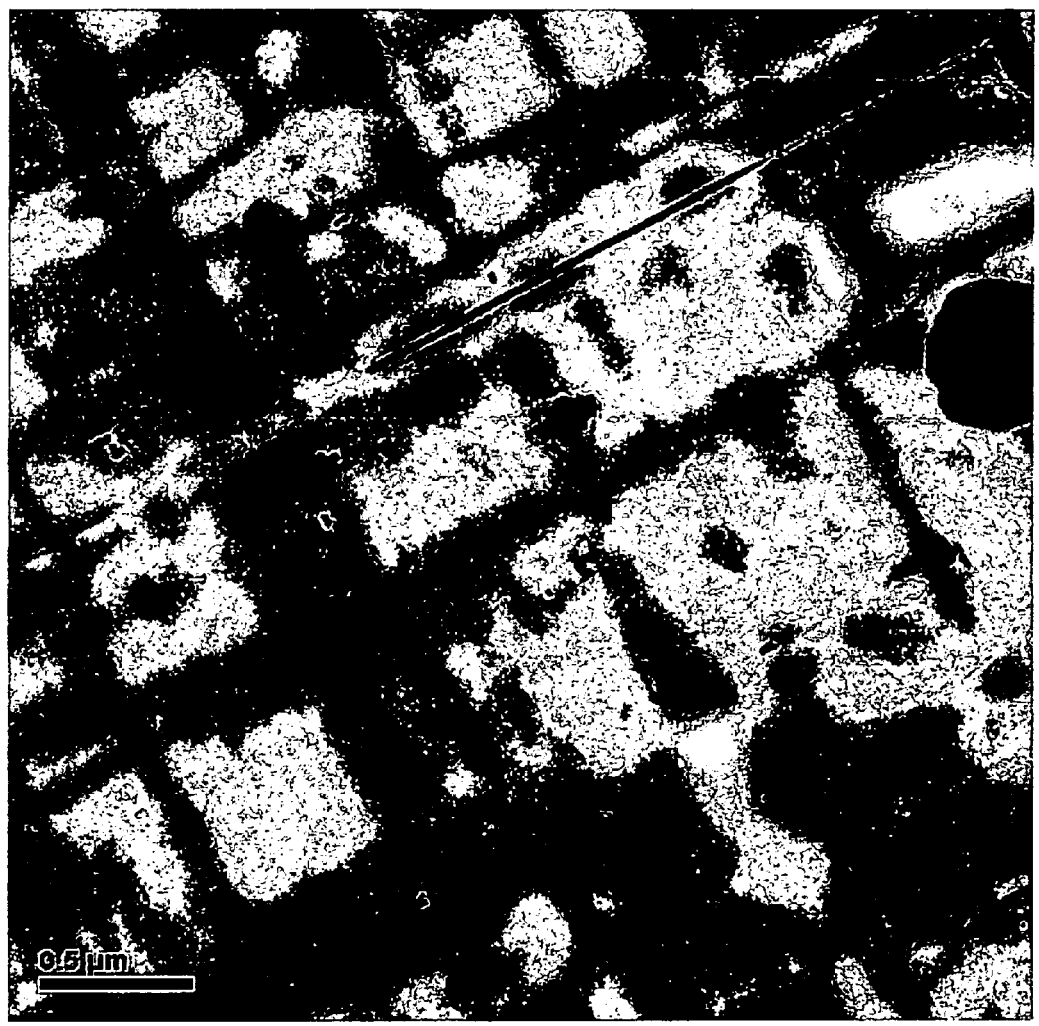
FIG. 6 is a plan-view TEM micrograph of a 600 Å, 17% SiGe-on-insulator substrate material prepared using a heating step in which the temperature was 100° C. below the melting point of a 26% SiGe alloy.
Figure 7:
FIG. 7 is a plan-view TEM micrograph of a 60 nm 17% SiGe-on-insulator substrate prepared using the processing steps of the present invention, i.e., prepared using a heating step in which the temperature is at or near the melting point of a 19% SiGe alloy.

An example of the defect reduction using the method of the present invention is illustrated in FIGS. 6 (Prior Art) and 7 (Invention). The initial structure, in each case, was a 600 Å, 17% pseudomorphically strained SiGe alloy grown on a 550 Å Si SIMOX SOI wafer. FIG. 6 shows plan-view TEM micrograph results of the sample that was thermally mixed and oxidized at 1200° C. to a final Ge content of 26%. The heating, which is in accordance with the '138 application, was about 100° C. less than the melting point of the SiGe alloy layer. The defect density was about 5E7 $cm^{-2}$ threading defects and some misfit segments (or stacking faults) were evident. FIG. 7 shows plan-view TEM micrograph results of the same thermally mixed and oxidized at 1290° C. to a final Ge content of about 19% Ge (the temperature of heating is at or near the melting point of the SiGe alloy layer, See FIG. 5). No defects are evident in the latter image, in fact, extended TEM analysis showed no defects which suggests a defect density at or below the $10^6$ cm$^{-2}$ range.

Figure 8:
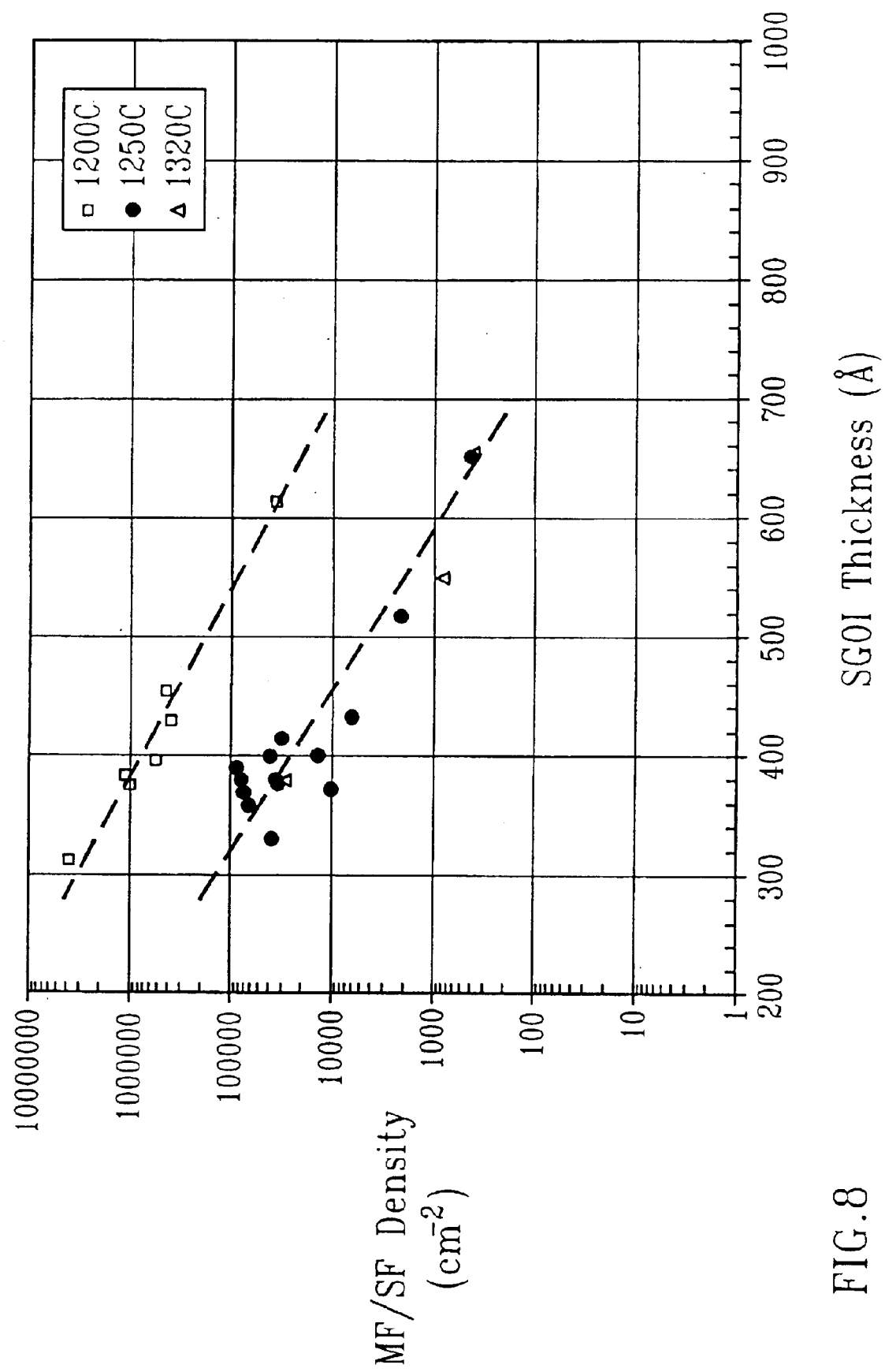
FIG. 8 is a graph of measured MF/SF density vs. SGOI thickness for various samples heated at different temperatures.

FIG. 8 shows the measured SF defect density versus final thickness in the SGOI fabricated by oxidation at 1200, 1250 and 1320° C. in a manner consistent with the '138 application and the present invention. All data are for 600 Å–17% SiGe initial layers grown on 550 Å SOI substrates. The figure shows nearly a two order of magnitude reduction in SF defect density using the present invention. Also suggested by the figure is the ability to control the SF defect density by controlling the final SGOI thickness.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invenetion in deail, what we claim as new and desire to secure by the Letters Patent is:

1. A substrate material comprising:
a Si-containing substrate;
an insulating region that is resistant to Ge diffusion present atop said Si-containing substrate, said insulating region comprising a crystalline or non-crystalline oxide or a crystalline or non-crystalline nitride; and
a substantially relaxed SiGe layer present atop said insulating region, wherein said substantially relaxed SiGe layer has a thickness of about 2000 mm or less and a stacking fault defect density of about $10^6$ defects/cm$^2$ or less, said stacking fault density, which is formed by using a heating step that is performed at one near the melting point of a selected SiGe alloy, is reduced from a SiGe layer that is formed by heating below said melting point.

2. The substrate material of claim 1 wherein said insulating region is patterned.

3. The substrate material of claim 1 wherein said insulating region is unpatterned.

4. The substrate material of claim 1 wherein said insulating region is a buried oxide region.

5. The substrate material of claim 1 wherein said substantially relaxed SiGe layer has a measured lattice relaxation of from about 1 to about 99%.

6. A heterostructure comprising:
a Si-containing substrate;
an insulating region that is resistant to Ge diffusion present atop the Si-containing substrate, said insulating region comprising a crystalline or non-crystalline oxide or a crystalline or non-crystalline nitride;
a substantially relaxed SiGe layer present atop the insulating region, wherein the substantially relaxed SiGe layer has a thickness of about 2000 nm or less and stacking fault defect density of about $10^6$ defects/cm$^2$ or less, said stacking fault density, which is formed by using a heating step that is performed at one near the melting point of a selected SiGe alloy, is reduced from a SiGe layer that is formed by heating below said melting point; and
a strained Si layer formed atop the substantially relaxed SiGe layer.

7. The heterostructure of claim 6 wherein said insulating region is patterned.

8. The heterostructure of claim 6 wherein said insulating region is unpatterned.

9. The heterostructure of claim 6 wherein said insulating region barrier layer is a buried oxide region.

10. The heterostructure of claim 6 wherein said substantially relaxed SiGe layer has a measured lattice relaxation of from about 1 to about 99%.

11. The heterostructure of claim 6 wherein said strained Si layer comprises an epi-Si layer.

12. The heterostructure of claim 6 wherein alternating layers of relaxed SiGe and strained Si are located atop said strained Si layer.

13. The heterostructure of claim 6 wherein said strained Si layer is replaced with a lattice mismatched compound selected from the group consisting of GaAs and GaP.

* * * * *

UNITED STATES PATENT AND TRADEMARK OFFICE
CERTIFICATE OF CORRECTION

| | | |
|---|---|---|
| PATENT NO. | : 7,049,660 B2 | Page 1 of 1 |
| APPLICATION NO. | : 10/448948 | |
| DATED | : May 23, 2006 | |
| INVENTOR(S) | : Stephen W. Bedell et al. | |

It is certified that error appears in the above-identified patent and that said Letters Patent is hereby corrected as shown below:

<u>Column 11, Line 32:</u>
"about 2000 mn" should be -- about 2000 nm --

Signed and Sealed this

Twenty-first Day of November, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,049,660 B2 | Page 1 of 1 |
| APPLICATION NO. | : 10/448948 | |
| DATED | : May 23, 2006 | |
| INVENTOR(S) | : Stephen W. Bedell et al. | |

It is certified that error appears in the above-identified patent and that said Letters Patent is hereby corrected as shown below:

<u>Column 11, Claim 1, Line 34:</u>

"one" should read -- or --

<u>Column 12, Claim 6, Line 17:</u>

"one" should read -- or --

Signed and Sealed this

Twenty-fifth Day of December, 2007

JON W. DUDAS
*Director of the United States Patent and Trademark Office*